(12) United States Patent
Scofield et al.

(10) Patent No.: US 8,436,246 B1
(45) Date of Patent: May 7, 2013

(54) REFRIGERANT LINE ELECTRICAL GROUND ISOLATION DEVICE FOR DATA CENTER COOLING APPLICATIONS

(71) Applicant: Calvary Applied Technologies, LLC, West Henrietta, NY (US)

(72) Inventors: William H. Scofield, Batavia, IL (US); Scott H. Baube, Honeoye, NY (US)

(73) Assignee: Calvary Applied Technologies, LLC, West Henrietta, NY (US)

( * ) Notice: Subject to any disclaimer, the term of this patent is extended or adjusted under 35 U.S.C. 154(b) by 0 days.

(21) Appl. No.: 13/666,437

(22) Filed: Nov. 1, 2012

Related U.S. Application Data

(60) Provisional application No. 61/716,019, filed on Oct. 19, 2012.

(51) Int. Cl.
*H01B 17/14* (2006.01)
*F16B 33/00* (2006.01)

(52) U.S. Cl.
USPC .................................. 174/137 R; 174/138 R

(58) Field of Classification Search .......... 361/676–678, 361/679.46–679.49, 679.52, 679.53, 688–701; 174/138 R, 137 R, 252; 312/236; 454/184
See application file for complete search history.

(56) References Cited

U.S. PATENT DOCUMENTS

| | | | |
|---|---|---|---|
| 4,895,203 A | 1/1990 | McLaren | |
| 4,924,677 A | 5/1990 | Quack | |
| 5,177,970 A * | 1/1993 | Chang | 62/3.1 |
| 5,184,879 A | 2/1993 | Brossardt et al. | |
| 5,462,110 A | 10/1995 | Sarver | |
| 5,471,850 A | 12/1995 | Cowans | |
| 5,676,197 A | 10/1997 | Diebold et al. | |
| 5,690,014 A * | 11/1997 | Larkin | 87/13 |
| 5,701,751 A | 12/1997 | Flores | |
| 5,740,018 A | 4/1998 | Rumbut, Jr. | |
| 5,823,006 A | 10/1998 | Jung | |
| 5,943,211 A | 8/1999 | Havey et al. | |
| 5,974,902 A | 11/1999 | Scofield | |
| 6,067,223 A | 5/2000 | Diebel et al. | |
| 6,134,109 A | 10/2000 | Muller et al. | |
| 6,154,368 A | 11/2000 | Scofield | |
| 6,359,782 B1 | 3/2002 | Scofield | |

(Continued)

FOREIGN PATENT DOCUMENTS

| | | |
|---|---|---|
| DE | 20000715 | 5/2000 |
| DE | 20008411 | 7/2000 |
| FR | 2623047 | 5/1989 |

OTHER PUBLICATIONS

Alcatel-Lucent et al., Advanced Refrigerant-bsed Cooling Technologies for Information and Communications Infrastructure (ARCTIC), Jul. 21, 2009.

(Continued)

*Primary Examiner* — Yuriy Semenenko
(74) *Attorney, Agent, or Firm* — Woods Oviatt Gilman LLP; Katherine H. McGuire, Esq.

(57) ABSTRACT

An isolator to electrically isolate the A/C and D/C ground planes in a refrigerant network. When positioned along conductive refrigerant lines flowing with a dielectric refrigerant, the isolator is formed of a material which will prevent refrigerant permeation through its walls, and is further designed with dimensions that will prevent material breakdown and potentially damaging arcing due to triboelectric effect.

5 Claims, 9 Drawing Sheets

U.S. PATENT DOCUMENTS

| Patent No. | Date | Inventor | Ref |
|---|---|---|---|
| 6,443,010 B1 | 9/2002 | Scofield | |
| 6,446,449 B2 | 9/2002 | Krauter | |
| 6,591,896 B1 | 7/2003 | Hansen | |
| 6,628,520 B2 | 9/2003 | Patel et al. | |
| 6,643,123 B2 | 11/2003 | Hartel et al. | |
| 6,690,578 B2 | 2/2004 | Edelmann | |
| 6,734,801 B2 | 5/2004 | Scofield | |
| 6,772,604 B2 | 8/2004 | Bash | |
| 6,798,660 B2 | 9/2004 | Moss et al. | |
| 6,819,563 B1 | 11/2004 | Chu et al. | |
| 6,833,992 B2 * | 12/2004 | Kusaka et al. | 361/699 |
| 6,986,382 B2 | 1/2006 | Upadhya et al. | |
| 7,003,966 B2 | 2/2006 | Sharma et al. | |
| 7,012,807 B2 | 3/2006 | Chu et al. | |
| 7,057,893 B2 | 6/2006 | Nicolai et al. | |
| 7,074,123 B2 | 7/2006 | Bettridge et al. | |
| 7,076,964 B2 | 7/2006 | Sakakibara | |
| 7,086,247 B2 | 8/2006 | Campbell et al. | |
| 7,106,590 B2 | 9/2006 | Chu et al. | |
| 7,142,425 B2 * | 11/2006 | Tomioka et al. | 361/699 |
| 7,184,269 B2 | 2/2007 | Campbell et al. | |
| 7,273,088 B2 | 9/2007 | Malone | |
| 7,312,995 B2 | 12/2007 | Wilson et al. | |
| 7,340,919 B2 * | 3/2008 | Sami et al. | 62/498 |
| 7,367,384 B2 | 5/2008 | Madara et al. | |
| 7,385,810 B2 | 6/2008 | Chu et al. | |
| 7,428,151 B2 | 9/2008 | Sonnabend et al. | |
| 7,437,887 B2 | 10/2008 | Hinder et al. | |
| 7,466,549 B2 | 12/2008 | Dorrich et al. | |
| 7,525,207 B2 | 4/2009 | Clidaras | |
| 7,539,020 B2 | 5/2009 | Chow et al. | |
| 7,559,209 B2 | 7/2009 | Nicolai et al. | |
| 7,614,247 B2 | 11/2009 | Nicolai et al. | |
| 7,635,020 B2 | 12/2009 | Hartel et al. | |
| 7,637,118 B2 | 12/2009 | Nicolai et al. | |
| 7,707,712 B2 | 5/2010 | Kim | |
| 7,830,657 B2 | 11/2010 | Chu et al. | |
| 7,878,889 B2 | 2/2011 | Day | |
| 7,881,057 B2 | 2/2011 | Fink et al. | |
| 7,900,468 B2 | 3/2011 | Spearing | |
| 7,905,105 B2 | 3/2011 | Fair et al. | |
| 7,963,118 B2 | 6/2011 | Porter et al. | |
| 8,145,363 B2 | 3/2012 | Bean, Jr. et al. | |
| 8,261,565 B2 | 9/2012 | Borror | |
| 8,349,178 B2 * | 1/2013 | Lopes | 210/222 |
| 2002/0134528 A1 | 9/2002 | Sterner | |
| 2002/0176226 A1 | 11/2002 | Richardson et al. | |
| 2004/0070942 A1 | 4/2004 | Tomioka et al. | |
| 2005/0120737 A1 | 6/2005 | Borror et al. | |
| 2005/0213306 A1 | 9/2005 | Vos et al. | |
| 2006/0232945 A1 | 10/2006 | Chu et al. | |
| 2007/0128053 A1 | 6/2007 | Stamper | |
| 2007/0151707 A1 | 7/2007 | Lyons et al. | |
| 2007/0152507 A1 | 7/2007 | Lazzarato et al. | |
| 2007/0283716 A1 | 12/2007 | Marsala | |
| 2008/0198549 A1 | 8/2008 | Rasmussen et al. | |
| 2008/0266726 A1 | 10/2008 | Murakami et al. | |
| 2009/0046430 A1 | 2/2009 | Brewer et al. | |
| 2009/0086434 A1 | 4/2009 | Hodes et al. | |
| 2009/0173473 A1 | 7/2009 | Day | |
| 2009/0225514 A1 | 9/2009 | Correa et al. | |
| 2009/0301114 A1 | 12/2009 | Rowley et al. | |
| 2009/0308579 A1 | 12/2009 | Johnson et al. | |
| 2010/0165572 A1 | 7/2010 | Fink et al. | |
| 2010/0230079 A1 | 9/2010 | Byers et al. | |
| 2010/0300648 A1 | 12/2010 | Grantham | |
| 2010/0300650 A1 | 12/2010 | Bean, Jr. | |
| 2010/0305775 A1 | 12/2010 | Bean, Jr. et al. | |
| 2010/0328885 A1 | 12/2010 | Scofield et al. | |
| 2011/0247780 A1 | 10/2011 | Scofield | |

OTHER PUBLICATIONS

Scofield Bill, Alcatel-Lucent Modular Cooling Solution Tests results for operation without fans on pumped, two-pahse modular cooling system, Technology White Paper.

Scofield Bill, Keeping Cool in the Data Center, A High-Efficiency Modular Solution, Strategic White Paper.

Scofield Bill, Alcatel-Lucent Modular Cooling Solution Pumped two-phase modular cooling humidity variation test results, Technology White Paper.

Scofield Bill, Alcatel-Lucent Modular Cooling Solution Redundancy test results for pumped, two-phase modular cooling system, Technology White Paper.

Patterson Michael K. et al., The State of Data Center Cooling, White Paper.

Derby Stephen et al., Patent Cooperation Treaty International Search Report for International Application No. PCT/US2011/0470514; Aug. 9, 2011 filing date.

Liebert Corporation, Patent Cooperation Treaty International Search Report for International Application No. PCT/US2005/040745; Nov. 10, 2005 filing date.

Scofield Bill, Alcatel-Lucent Modular Cooling Solution Test Results for Operation with Extended Length Flex Hoses, Technology White Paper.

* cited by examiner

REFRIGERANT LINE ELECTRICAL GROUND ISOLATION DEVICE FOR DATA CENTER COOLING APPLICATIONS

BACKGROUND OF THE INVENTION

The present invention generally relates to electrical insulators, and more particularly relates to an electrical insulator (also referred to herein as an "isolator") for electrically isolating different electrical ground systems by locating the isolator between and interconnecting separated lengths of electrically conductive refrigerant lines which extend between the ground systems and carry a liquid refrigerant therethrough for cooling electronic devices.

Electronic equipment is known to generate heat which must be rejected from the device to prevent overheating and malfunction. Some industries require concurrent operation of many electronic devices positioned in close proximity to each other which generates an enormous quantity of heat which must be constantly drawn away from the electronic devices. The electronic devices (e.g. computer servers) are typically placed in electronic device frames or racks which are placed in repeating rows within a large room called a "data room" or "data center". Various methods are used to cool the electronic devices. For example, it is known to use a liquid refrigerant such as R134a which is pumped through metal lines to a heat exchanger located in close proximity to the electronic device. Metal lines are preferred since they prevent permeation of the refrigerant through the walls of the lines. One potential drawback of using electrically conductive metal lines to carry the refrigerant from the pump to a location close to the electronic devices is interference between the ground of the A/C powered refrigerant pump and the ground of the D/C powered electronic devices. While one potential solution would be to use nonconductive lines such as PTFE or ETFE, for example, such nonconductive lines is susceptible to refrigerant permeation due to the molecular make-up of these non-conductive materials. For short lengths of lines, this is not usually a problem, but in applications where long lengths of lines are required (e.g., as in the above-described data rooms), the surface area of lines is necessarily higher and the potential for refrigerant leakage therethrough is much greater.

As stated above, while metal lines are preferred for carrying the refrigerant from the pump to the heat exchangers located in proximity to the electronic devices, since the metal lines are electrically conductive, the potential exists that the different electric grounding schemes of the A/C powered pump and D/C powered electronic devices may interfere with one another through these interconnecting, conductive metal lines. Furthermore, the refrigerant itself is generally non-conductive and may develop a static electric charge as it flows through a non-conductive material such as the above plastics due to the triboelectric effect. A need therefore exists for an isolator that will electrically isolate the A/C and D/C grounding schemes without any refrigerant leak therethrough and without causing any arcing of static electric charge from the refrigerant through the isolator component.

SUMMARY OF THE INVENTION

The present invention addresses the above need by providing an isolator for electrically isolating the AC powered pump ground from the DC powered electronic devices ground. The isolator component is configured to interconnect two separate lengths of conductive lines which extend and route refrigerant between an AC powered refrigerant pump and the DC powered heat exchangers and electronic equipment located on the equipment racks.

The isolator component is preferably configured in a cylindrical tube shape having an inner wall defining a conduit through which the refrigerant may travel from one metal line length to the interconnected metal line length. The isolator component wall thickness is chosen to be in a range that will prevent or inhibit the leakage (permeation) of refrigerant therethrough while also preventing or inhibiting the discharge or arcing of any static electric charge from the refrigerant through the isolator wall. The length of the isolator component is also of a length calculated to minimize charge buildup. In one embodiment, the isolator component is a relatively short piece of nonconductive line having opposite ends which are configured for attachment to the ends of the separate lengths of the flexible metal lines wherethrough refrigerant travels to and from the heat exchangers. The isolator component may be located at other suitable locations between the pump and heat exchangers as will be described in more detail below.

The isolator component may be made of any suitable, electrically insulating material such as High Density Polyethylene (HDPE), for example, which is strong and durable over a range of temperatures.

Additional objects, advantages and novel features of the present invention will be set forth in part in the description which follows, and will in part become apparent to those in the practice of the invention, when considered with the attached figures.

BRIEF DESCRIPTION OF THE DRAWING

The accompanying drawing forms a part of this specification and is to be read in conjunction therewith, wherein like reference numerals are employed to indicate like parts in the various views, and wherein.

Where applicable like reference characters designate identical or corresponding components and units throughout the several views, which are not to scale unless otherwise indicated.

DETAILED DESCRIPTION OF THE INVENTION

Figure 1:
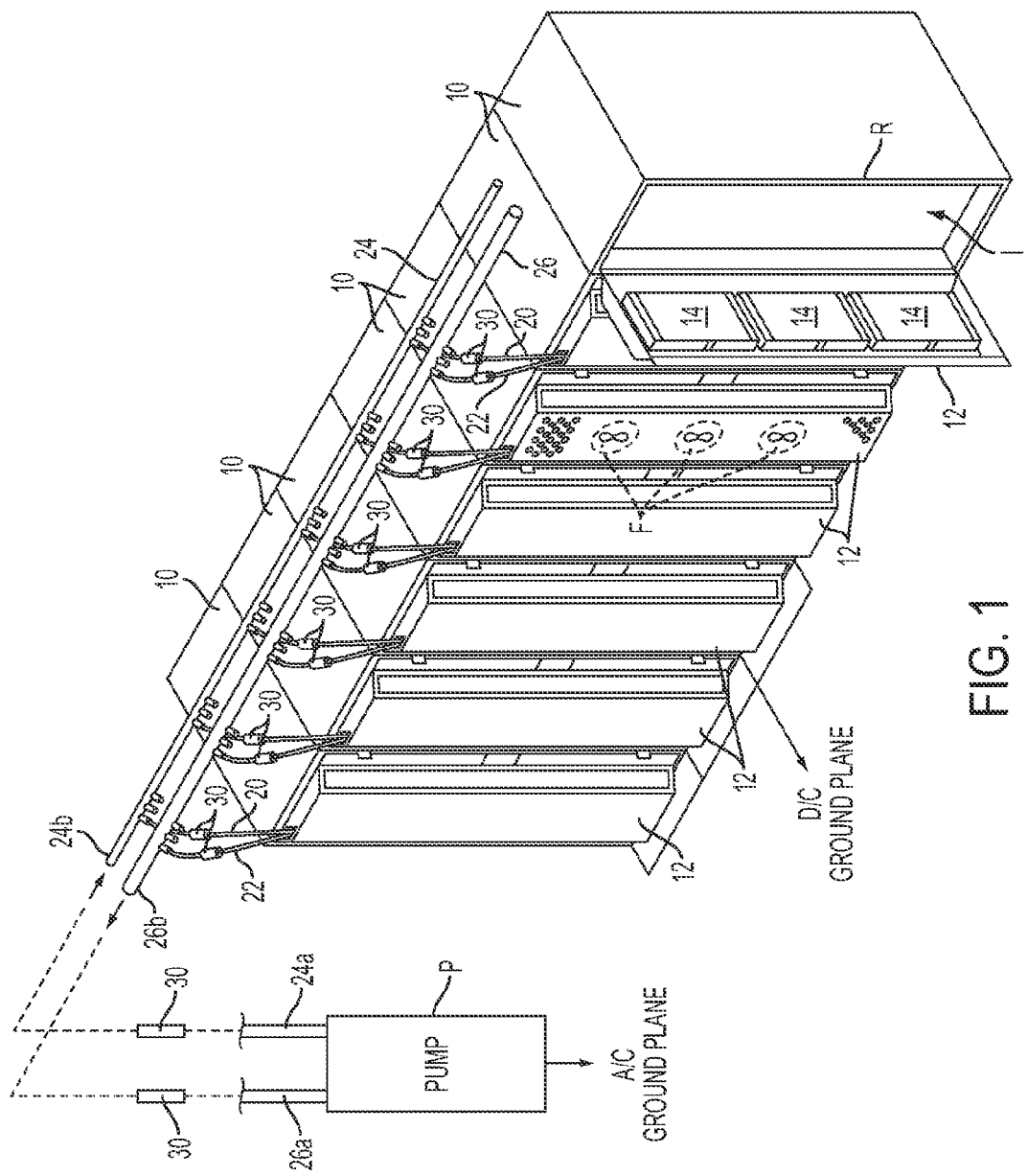
FIG. 1 is a perspective view of a row of server racks with refrigerant circuit according to an embodiment of the invention.

Many fluid handling operations can generate static electricity, especially if the fluid is a good dielectric as is the case with a virgin refrigerant (one that uses no oil) with a dielectric strength on the order of 2-10 KV/mil. This becomes a problem when non-conducting pipes or hoses are used without adequate bonding. In the case of the present invention the intention is to electrically isolate and prevent electrical bonding between two separate ground planes, in this case A/C and D/C ground planes. These ground planes are designed differently such that, in the D/C case, a lightning strike to the building will not disrupt the D/C power equipment normally found in a telecommunications facility. This isolation between grounding schemes introduces static charge buildup in non-conductive sections of refrigerant hose assemblies. Here a non-conductive material is defined as a material having a volume resistivity higher than $10^9$ Ω·m.

When electrostatic charge is generated in a plastic hose, or in this case a non-conductive isolator/insulator, an excess charge of polarity resides in the refrigerant flow cross-section and an opposing polarity charge resides on the inner isolator wall. Electrostatic attraction forces act to bring these charges together to be neutralized but, because of much higher dynamic forces in the flow, only those charged molecules that enter the stagnant boundary layer will be neutralized by electrostatic attraction. The moving charged molecules near the boundary layer will tend to migrate by electrical conduction through the refrigerant as they travel downstream where they eventually will be neutralized by bound charges on the inner metal conductive section of the stainless steel, or similar metallic hose, braided and corrugated section of hose wall. Each time this neutralizing charge transfer occurs, there will be an equal probability that a nearby triboelectric charge separation event may also occur to restore the net equilibrium streaming current resulting in an arc. If not properly designed the arc can burn through the insulator/isolator and thereby cause a leak point. The isolator therefore requires a length calculated to minimize charge buildup and a wall thickness calculated to prevent triboelectric discharge through its walls.

A specific operational hazard associated with non-uniform electric field concentrations is the tendency for electrical breakdown to occur through a hose, or in this case, the isolator wall. Such discharges can arc and puncture the hose isolator wall causing a refrigerant leak. For example, a non-uniform electric field concentration in the isolator wall may occur when the isolator is placed in contact with a grounded sharp metal object, such as the edge of an angle, plate or other similar conductive structure. In this case, the localized ground contact will concentrate the electric field and potentially cause the local electrostatic surface charge density on the inner wall to increase, resulting in a further increase in the local electric field and possible breakdown of the dielectric isolator material. For this reason, a non-conductive isolator/insulator designed with a thick wall provides protection by preventing the triboelectric discharge discussed in the previous paragraph.

Referring now the drawing, there is seen in FIG. 1 a plurality of electronic equipment racks 10 positioned in side-by-side relationship to form a row as is typically found in many commercial telecommunication data centers, for example. Electronic equipment (not shown) such as computer servers are positioned inside the racks 10 on vertically spaced, parallel shelves located within the rack (not shown). Each rack 10 may be fitted with what is called a "cooling door" 12 which may be moved between open and closed conditions on the respective rack. The cooling doors are designed with one or more heat exchangers 14 and respective fans "F" designed to cool and remove the heated air rejected from the electronic components in the rack. When in the cooling door 12 is in the open condition shown to the far right in FIG. 1, the inside "I" of the rack 10 is exposed allowing access to the electronic components (not shown) located therein. This side of the server rack 10 is considered the rear side "R" since this is where the rear side of the electronic component is typically located. Most electronic devices are designed to reject internally generated heat out the rear of the device. As such, the most efficient positioning of the cooling door 12 is at the rear side R of the rack.

Refrigerant is delivered to and from each heat exchanger 14 via flexible supply and return lines 20 and 22, respectively, which are connected to rigid main supply and return lines 24 and 26, respectively, ultimately connecting to a refrigerant pump P (see FIG. 1) operable to circulate the refrigerant through the supply and return lines. Many refrigerants, such as the R134a preferred herein, are of a type that will convert from a liquid to a gas upon reaching a certain temperature which occurs as the refrigerant absorbs the heat being rejected from the electronic components in the racks 10. Thus, the main and heat exchanger supply lines 20, 24 will carry refrigerant in a liquid state while the main and heat exchanger return lines 22, 26 will carry refrigerant in a gaseous state. Since the gaseous state occupies a larger volume of space than the liquid state per unit, the diameter of the main return line 26 is larger than the diameter of the main supply line 24.

Refrigerant such as R134a has a tendency to permeate through many types of material, particularly plastic such as PTFE and ETFE, for example. It is therefore desirable to use refrigerant lines made of a material that is resistant to permeation of the refrigerant. Many metals are suitable for this purpose such as copper and stainless steel, for example, because these materials minimize permeation of gaseous refrigerant through their hose walls. While metal is a preferred material from a permeation-resistant standpoint, metal is also highly conductive. Since the supply and return lines extend between the A/C and D/C ground planes as explained above, the potential exists for destructive electrical interference between these two ground planes, and it is therefore the main objective of the present invention to electrically isolate the A/C and D/C ground planes along the refrigerant supply and return lines.

As seen in FIGS. 1 and 3-7, the present invention provides an electric isolator 30 for positioning at a strategic location such as in each of the supply and return lines and which is operable to electrically isolate the A/C/ and DC ground planes. As explained above, the refrigerant pump P is connected to the A/C ground plane while the heat exchanger fans F and electronic devices in the racks, the racks themselves and the doors 12 are grounded to the D/C ground plane as schematically indicated in FIG. 1. It is understood that although the electric isolators 30 are shown in the figures as being located on the flexible supply and return lines 20, 22 feeding each heat exchanger 14, they may also be located at other locations between the pump P and racks 10 (other components in the refrigerant network are not shown in the figures, e.g., compressor, for sake of clarity). For example, an isolator 30 may be located on each of the rigid supply and return lines 24 and 26, and may optionally be placed in closer proximity to pump P than the racks 10. In the refrigerant network depicted in FIG. 1, this placement would require just two isolators 30 rather than the 12 shown (it is also noted flexible supply and return lines 20,22 and respective isolators 30 are not shown on the far right door 12 for the sake of clarity).

Electric isolator 30 is thus provided for positioning between and interconnecting first and second lengths of refrigerant lines extending between A/C and D/C grounding planes.

Figure 3:
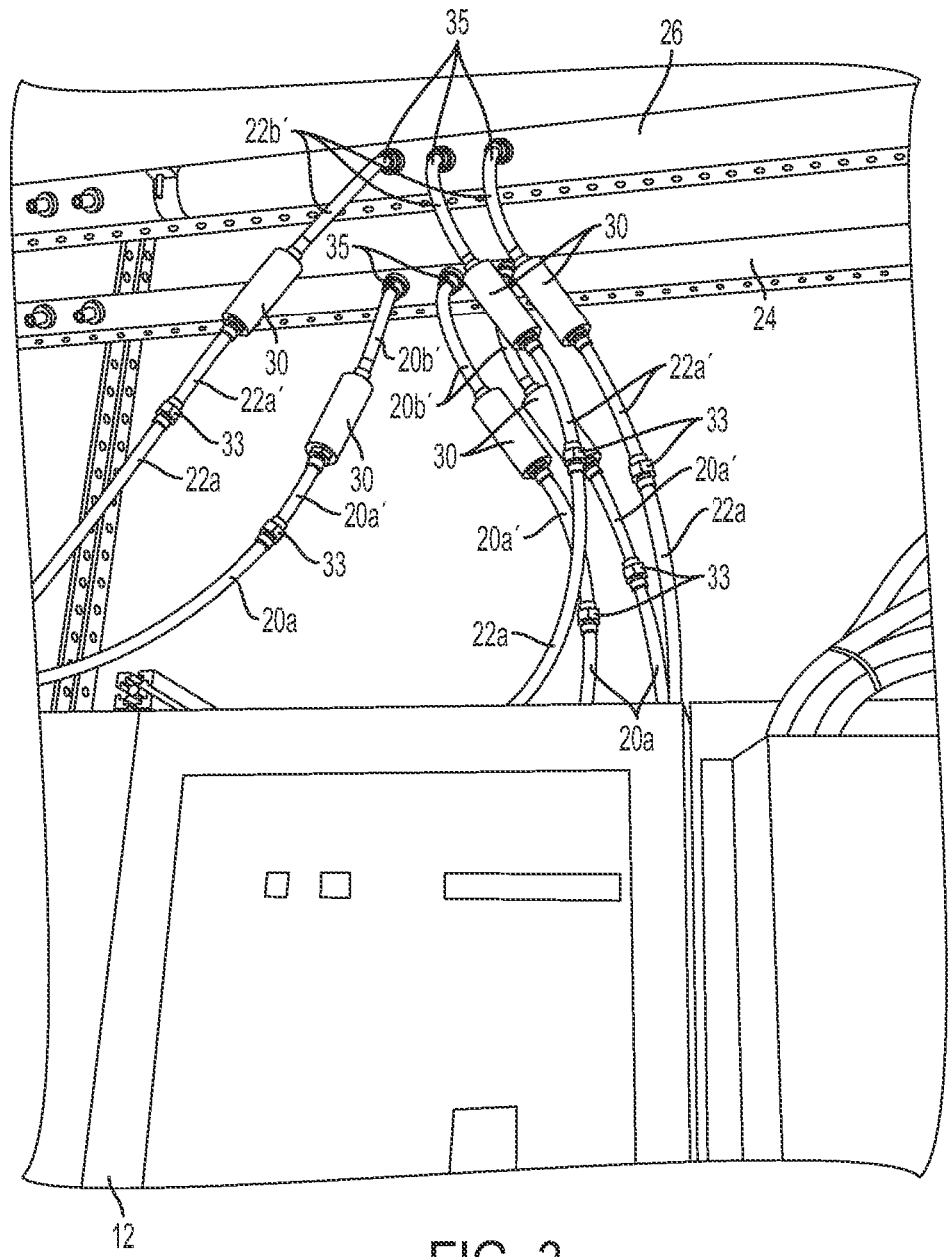
FIG. 3 is a perspective view, fragmented, of a portion of the refrigerant circuit and rack.

Referring to FIG. 3, an isolator 30 may be positioned along the flexible supply and return lines 22, respectively. As explained above, an isolator 30 may alternatively be positioned between first and second lengths 24a and 24b, respectively, and 26a and 26b, respectively, of the main supply line 24 and main return line 26 as shown schematically to the far left in FIG. 1.

Electric isolator 30 may be formed of a unitary piece of non-conductive material (e.g., High Density Polyethylene) having a preferably cylindrically shaped wall "W" having an inner surface 31 defining an central conduit "C" (see FIGS. 5 and 7) extending longitudinally between opposite first and second ends 30a and 30b thereof, respectively. Electric isolator 30 has a length "L" calculated to be of a size sufficient to electrically isolate the ground planes between first and second lengths (lengths 20a and 20b depicted in FIGS. 4, 6 and 7 for the sake of description) of refrigerant lines, and a combined length "L" and wall thickness "T" of a size sufficient to inhibit refrigerant permeation and triboelectric discharge through the wall when a dielectric refrigerant is flowing therethrough.

Figure 8:
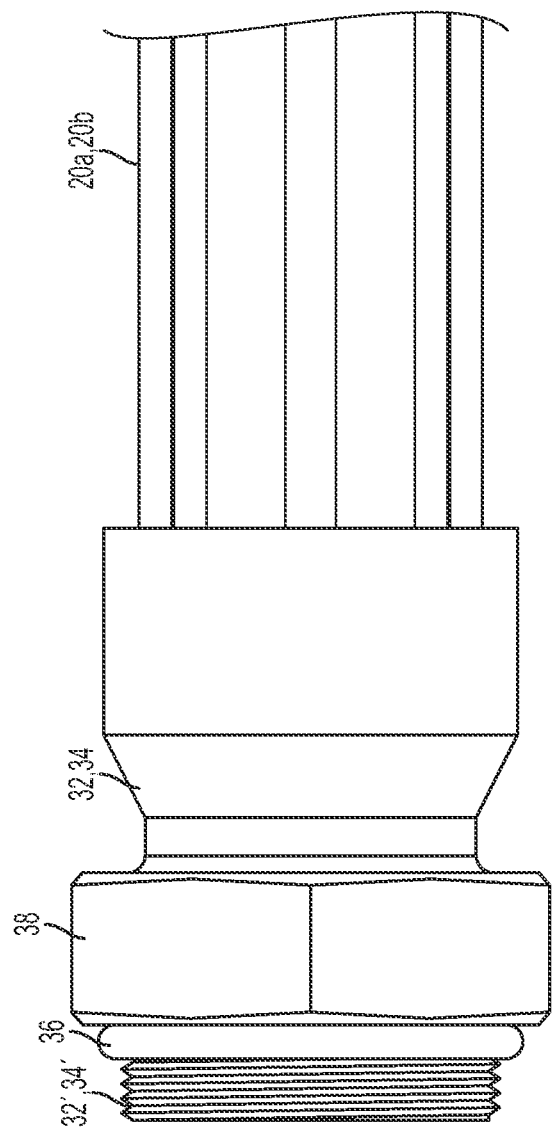
FIG. 8 is an enlarged, fragmented view of a fitting attached to a length of refrigerant line.

Any suitable interconnection means may be provided which allow isolator 30 to interconnect the first and second lengths of the refrigerant lines. For example, electric isolator first and second ends 30a and 30b may be internally threaded at 30a' and 30b' to allow removable threaded connection to respective first and second fittings 32 and 34 which are threaded at 32' and 34' (see FIG. 8) and located on the free ends of the first and second lengths of lines 20a and 20b, respectively.

Figure 9:
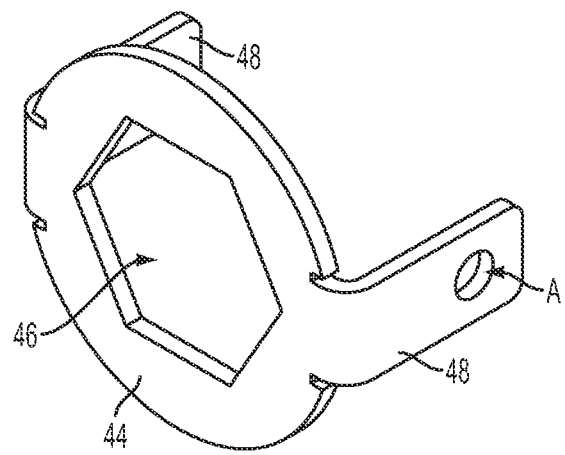
FIGS. 9-11 are perspective, front and side views of the bracket shown in FIG. 6.
Figure 10:
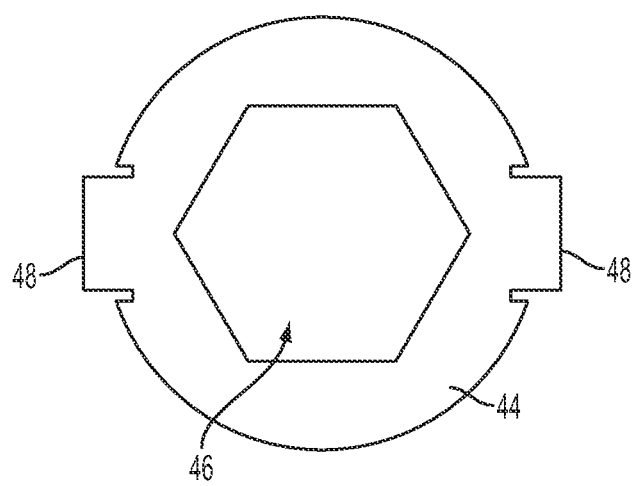
Figure 11:
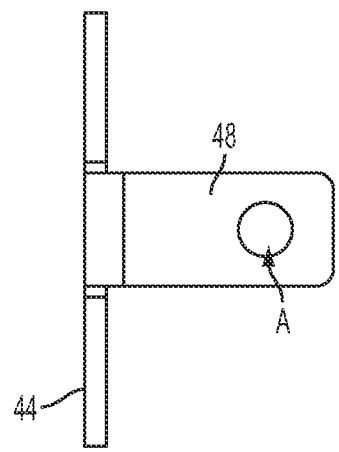

It is noted that it is important to ensure a good and reliable fluid and/or gaseous seal between the first and second lengths of refrigerant lines and the isolator 30. An O-ring 36 may be positioned about threaded end 32', 34' (see FIG. 8) to assist the sealing action. In the embodiment of fitting shown, a hex head 38 is located adjacent threaded head 32', 34' allowing a wrench to be engaged therewith to tighten the fitting to isolator 30. To prevent unintentional reverse rotation during operation of the refrigerant circuit (e.g., by repeated opening and closing of door 12 which twists the flexible lines 20, 22), a bracket 40, 42 may be attached to a respective fitting and refrigerant line length to rotationally fix the isolator 30 to the refrigerant lines. As seen in FIGS. 9-11, bracket 40,42 includes a head 44 having a central opening 46 sized to surround and closely abut hex head 38. Once fittings 32 and 34 have been fully tightened to respective ends of isolator 30, a screw S is passed through a respective aperture "A" formed through a respective shoulder strap 48 extending from head 44.

Figure 2:
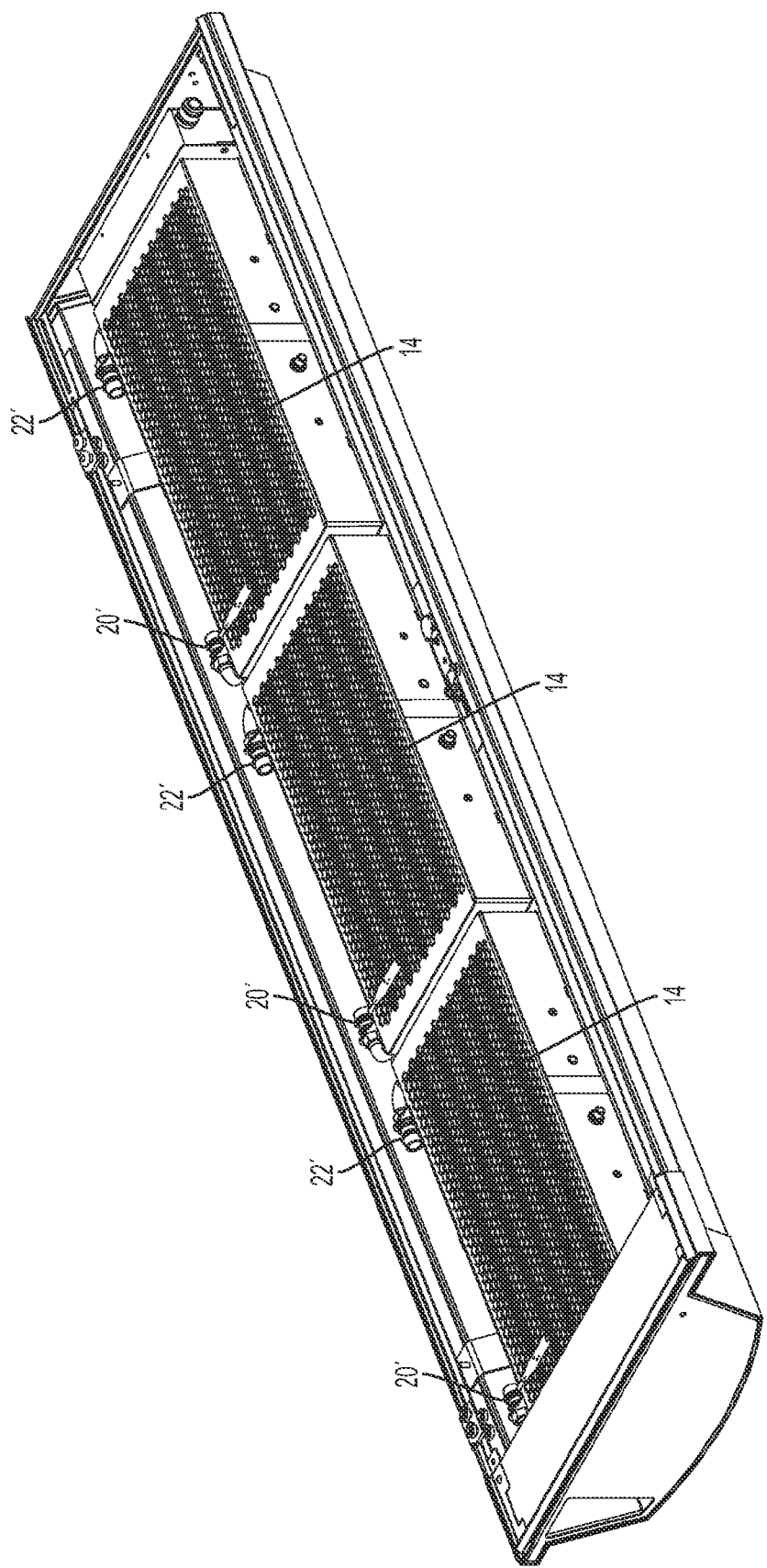
FIG. 2 is a perspective view of a cooling door according to an embodiment of the invention.
Figure 4:
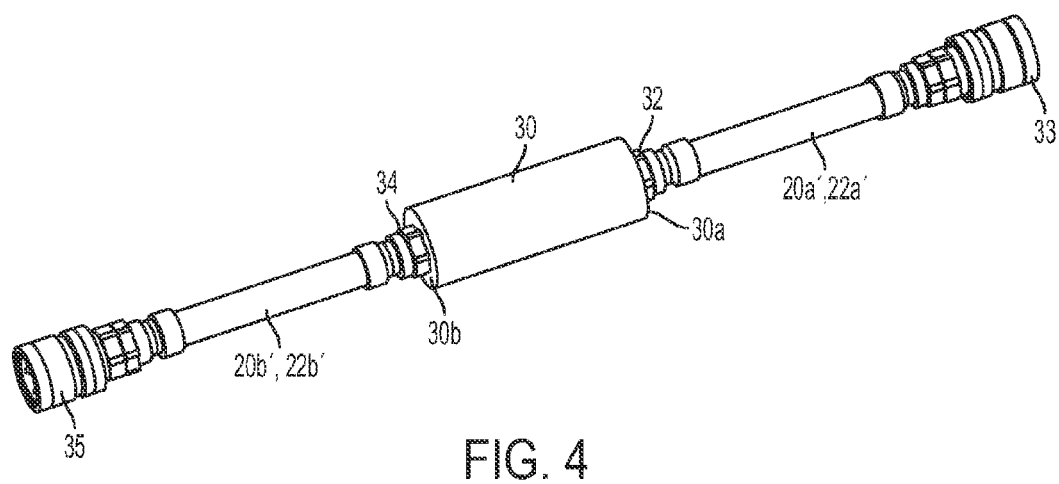
FIG. 4 is a perspective view of an embodiment of the present invention interconnecting first and second lengths of a refrigerant line.
Figure 5:
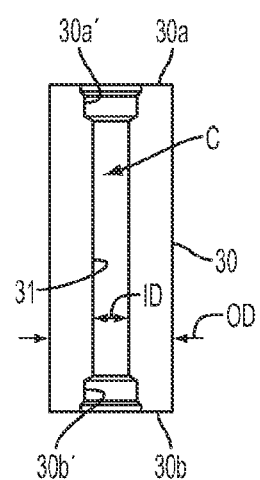
FIG. 5 is a longitudinal cross section of an embodiment of the invention.
Figure 6:
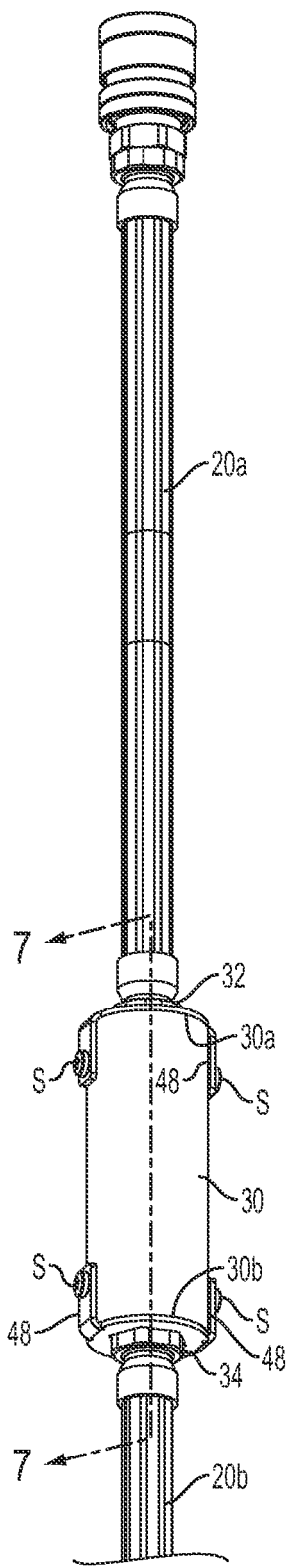
FIG. 6 is another perspective view of the view of FIG. 4 and further including rotational fixing brackets.
Figure 7:
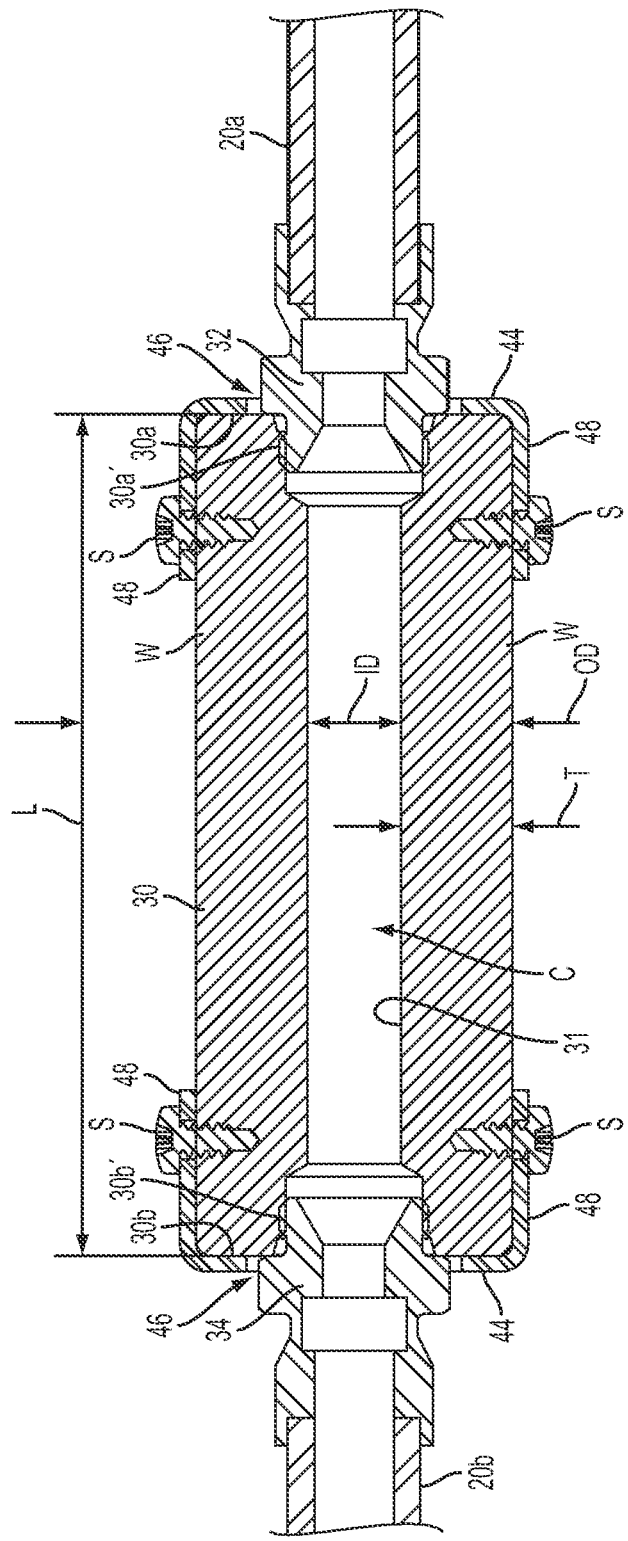
FIG. 7 is a cross-sectional view as taken through the line 7-7 of FIG. 6.

As stated above, repeated opening and closing of door 12 twists the flexible lines 20, 22. Also, as explained above, isolator 30 is relatively short and thick walled meaning it is much more rigid than the flexible hose supply and return lines. As such, this twisting action puts strain on the isolator connection points 32, 34 which may fail and cause a refrigerant leak. To alleviate this strain, the supply and return lines may be further segmented with additional lengths and connection points which will distribute the strain among these additional connection points so that no single connection point is subject to the entire strain. For example, as seen in FIGS. 3 and 4, additional short lengths 20a' and 20b' (for the supply lines) and lengths 22a' and 22b' (for the return lines) may be provided at either end of a respective isolator 30 via fittings 32 and 34, respectively. In this example, lengths 20a', 22a' and 20b,22b" are short and include additional fittings 33 and 35 at the ends thereof opposite isolator 30. Fittings 33 may attach to flexible line 20a, 22a leading toward the door 12 and connecting via fittings 20' and 22', respectively, to the heat exchangers 14 located therein (see FIG. 2). Depending on the refrigerant network design and distance between various components, fittings 35 may attach directly to the supply or return header 24, 26 as shown in FIG. 3, or may connect to additional lengths of flexible line which ultimately connect to the main refrigerant supply and return lines.

Figure 12:
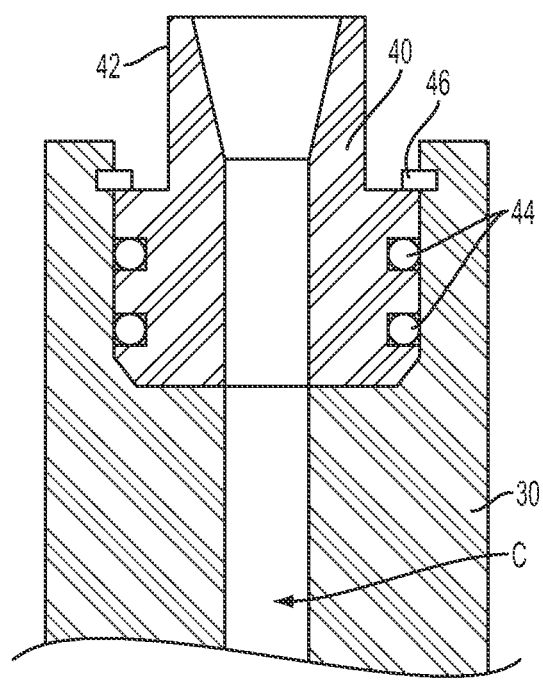
FIG. 12 is a longitudinal cross-sectional view of an alternate embodiment of fitting attached to a length of refrigerant line.

Any strain in the lines due, for example, to twisting of the line extending from the door 12 is now first imparted on the closest fitting to the door, i.e., in this example, fitting 33. By making fitting 33 a freely rotating (swivel) fitting, a majority of the twisting strain is absorbed at this point leaving little to no strain on the fitting 32 connecting directly to the isolator. In this regard, it is noted that any or all fittings described herein may be of the freely rotating type. For example, rather than the rotationally fixed fitting seen in FIG. 6, in the embodiment of FIG. 12 isolator 30 includes a freely rotating fitting 40 having a threaded neck 42 to which a complimentary fitting on the refrigerant line may be connected with a snap-ring 46 and one or more o-rings 43 such that the refrigerant line may rotate with respect to isolator 30 without leaking refrigerant.

As stated above, isolator 30 acts to electrically isolate the A/C and D/C ground planes in a refrigerant network. When positioned along conductive refrigerant lines flowing with a dielectric refrigerant, isolator 30 is formed of a material which will also prevent refrigerant permeation through its walls, and is further designed with dimensions that will prevent potentially damaging arcing due to triboelectric effect. The dimensions may vary depending on the specific refrigerant network components used. Appropriate isolator dimensions may be calculated for a specific application with the following providing a representative example.

EXAMPLE 1

In normal operation, the insulating properties of the plastic or non-conducting material used to manufacture the isolator impede the bound charge on the inner wall from being conducted to ground at external locations along the isolator. Typically, the volume resistivity of the plastic materials used is on the order of $10^{11}$ ohm·m and higher, depending upon the material. The relative dielectric constant $\in_I$ of the plastic is in the range of approximately 2.5 to 4.5, depending upon the material. For HDPE, for example, $\in_I$ is 2.3. The electrical breakdown voltage (i.e. the dielectric strength) of the plastic material is in the range of 300-500 kV/inch, depending on the material. For HDPE, the dielectric strength is in the range 450-500 kV/inch.

If the isolator cylinder is assumed to have a uniform electrostatic charge per unit length $\sigma_I$ on its inner surface the surrounding electric field $E_I$ in the radial region, with the radius r in the range of $r_i \leq r \leq r_o = r_i + t_I$, can be expressed as $$E_I = \frac{\sigma_I}{2\pi \varepsilon_I \varepsilon_O r} \qquad (1)$$

Where:
$E_I$ denotes the surrounding electric field
$r_i$ denotes the isolator interior radius
$r_o$ denotes the isolator outer radius
$t_I$ denotes the isolator thickness
$\in_R$ denotes the relative dielectric constant of the refrigerant (dimensionless)
$\in_I$ denotes the relative dielectric constant of the isolator (dimensionless)
$\in_O$ denotes the permittivity of free space (8.854 pF/m)

Note that the maximum field value occurs at $r=r_i$ and decreases inversely with distance through the wall thickness of the hose.

The dielectric strength of the isolator is specified as the static electric field at which a potential difference across the wall thickness will initiate an electrical breakdown ($E_{IB}$) of the dielectric material, i.e. HDPE for which the electric field limit is 450 to 500 kV/inch. Solving for $\sigma_I$ using Equation 1, the static electric charge per unit length on the inner hose wall that is required to produce an electric field of $E_{IB}$=450-500 kV/inch in the isolator wall thickness is given as:

$$\sigma_i = 2\pi \in_i \in_O (E_{IB} r) \quad (2)$$

The interior diameter of a commonly used flexible refrigerant hose is 3/8 inch, thus its radius is half that or 3/16 inch. For HDPE $\in_I$ is 2.3 which thus yields $$\sigma_I = 2\pi(2.3)\left(\frac{8.854 \times 10^{-12}}{39.37}\right)(450 \times 10^3)\left(\frac{3}{16}\right) = 0.2742 \ \mu coul/inch \quad (3)$$

Thus, the electric charge per unit length on the inner isolator wall required to produce the electric field that would initiate a breakdown in the isolator material (e.g., HDPE) is 2.742 μcoul/inch. The corresponding potential ($V_{IB}$) across the isolator wall to a grounded surface at the edge of the isolator is thus given by:

$$V_{IB} = \frac{\sigma_I}{2\pi \varepsilon_I \varepsilon_O} \ln\left(\frac{r_O}{r_I}\right) \quad (4)$$

where
$r_i$ denotes the isolator interior radius
$r_o$ denotes the isolator outer radius
$\in_I$ denotes the relative dielectric constant of the isolator (dimensionless)
$\in_O$ denotes the permittivity of free space (8.854 pF/m)
$\sigma_I$ denotes the electrostatic charge per unit length of the isolator material Here we choose an isolator outer radius $r_o$ whose parameters provide for (1) ease of manufacturing and (2) sufficient isolation properties. Given $r_o$ and the isolator thickness $t_I$ yields the value of the isolator inner radius $r_I$ since $r_i=r_o-t_I$.

As an example, consider a one inch diameter cylinder with a 3/8 inch internal bore ($t_I$=0.3125 inch). Using Equation 4, the potential ($V_{IB}$) across the isolator wall is calculated as follows:

$$V_{IB} = \frac{(2.742 \times 10^{-7})(39.37)}{2\pi(2.3)(8.854 \times 10^{-12})} \ln\left(\frac{0.5}{0.1875}\right) = 82,752 \ V \quad (5)$$

This voltage is significantly lower than the HDPE breakdown voltage of 450-500 kV and would thus be suitable for use as described herein. The above calculations indicate an HDPE isolator with an outer diameter of 1 inch with an interior bore of $$\frac{3}{8}$$

inch diameter is suitable. Other non-conductive materials (e.g., Nylon 66, etc.) may also be found to make a suitable isolator. The system designer may choose the isolator material with consideration given to the specific environmental and equipment system architecture and with the appropriate isolator dimensions for a given material calculated in accordance with the teachings of the present disclosure.

Note that the refrigerant flowing through the isolator can build a charge large enough to achieve the electrical breakdown voltage of $E_{IB}$=450-500 kV/inch if the non-conductive section is too long. In addition, the refrigerant contained in a metallic hose up to the point of the isolator device can contain charge, some of which may dissipate to the walls of the electrically conductive hose material to that point. Charge can remain, however, due to the refrigerant being a dielectric. Thus, an initial charge should be considered.

The goal is to determine how long the electrically non-conductive isolator has to be such that triboelectric charge does not build to the point where breakdown of the non-conductive isolator occurs. Since the inner diameter of the isolator is the same size as the hose, and the flow is turbulent, charge continues to build in the isolator or non-conductive section.

For the initial charge ($q_0$), at any later time (t) the charge (q) is given by:

$$q = q_0 \exp\left(-\frac{t}{\tau_r}\right) \quad (6)$$

Where the relaxation time constant $\tau_R$ (i.e. the time required for the charged flow to decay) of the refrigerant is given by:

$$\tau_r = \frac{\varepsilon_R \varepsilon_O}{\sigma_R} (\sec) \quad (7)$$

Where:
$\in_R$ is the relative dielectric constant of the refrigerant (dimensionless)
$\in_O$ is the permittivity of free space (8.854 pF/m)
$\sigma_R$ is the refrigerant electrical conductivity (Siemens/m)
$\tau_r$ is the refrigerant relaxation time constant If the electrical resistivity of a material is known rather than its conductivity, the reciprocal of resistivity may be used given that:

$$\sigma = \frac{1}{\rho} \quad (8)$$

Where:
$\sigma$ denotes electrical conductivity
$\rho$ denotes electrical resistivity For refrigerant R134A $\rho$=7.4e9 ($\Omega$cm)=0.135 (pS/m)=$\sigma_R$ for the example presented herein, and $\in_R$=9.4 (dimensionless).

The volumetric flow rate (Q) of refrigerant through this particular line is ~0.75 gpm or a flow velocity of 2.17 ft/sec. The refrigerant relaxation time constant $\tau_r$ indicates that any pre-charge in the refrigerant will not begin to decay in the length of flexible metallic hose contemplated being used in typical applications and therefore any pre-charge in the refrigerant will add to triboelectric charge building up in the non-conductive isolator section.

The breakdown voltage for HDPE is $E_{IB}$=450-500 kV/inch, the corresponding potential ($V_{IB}$) across the isolator wall to a uniform grounded surface at its edge was calculated to be $V_{IB}$=179,519 volts/inch and the electric charge per unit length on the inner isolator wall required to produce the electric field that would initiate a breakdown in the isolator material was $\sigma_f$=2.742 µcoul/inch. Consider a point ground (such as the isolator making external contact with a sharp metallic edge) that is able to concentrate the charge. In this case, the uniform ground field becomes a best case scenario. A thin walled non-conductive hose or isolator will not be sufficient to insulate and prevent electrical static discharge and thus an arc can burn through its walls to a grounded surface leading to a loss of refrigerant, a substance controlled by the Environmental Protection Agency. Therefore it is imperative to design an isolator that is suitable for manufacturing as well having a high safety factor.

Measurements obtained indicate a voltage before the non-conductive isolator can be 10 kV with a point ground and possibly higher. In a time duration of one second, the refrigerant used in this particular application can travel approximately one foot. During this time the refrigerant carries its initial charge in addition to any triboelectric charge it accumulates at it passes though the isolator. The longer the isolator is, the higher the charge potential, which increases the probability for arcing to occur. Equation 6 can be used to calculate the charge at a given time (t) with a measured initial charge ($q_0$). Note that it is preferable to make the isolator shorter than one foot in length in order to achieve a high safety factor. In an application where aesthetics play a role, a shorter isolator length is preferred. The length cannot be made too short as there is potential for arcing between the metallic sections of hose connecting the isolator on either end thus negating the usefulness of the isolator. A length of 4 inches was found to be suitable through laboratory testing.

What is claimed is:

1. An electric isolator for positioning between and interconnecting first and second lengths of conductive refrigerant lines extending between A/C and D/C ground planes, said electric isolator formed of a unitary piece of non-conductive material having a conduit extending longitudinally between opposite first and second ends thereof, said electric isolator having a length calculated of a size such that triboelectric charge does not build to the point where breakdown of said non-conductive material occurs, and a wall thickness of a size sufficient to prevent triboelectric discharge through said wall when a dielectric refrigerant is flowing therethrough.

2. The electric isolator of claim 1, wherein said non-conductive material is High Density Polyethylene.

3. The electric isolator of claim 2 wherein said first and second ends are internally threaded to allow said first and second ends to be each removable threaded to a respective first and second fittings located on said first and second lengths of refrigerant lines, respectively.

4. The electric isolator of claim 3 and further comprising first and second brackets configured to be attached to and between said first and second ends of said isolator and said first and second fittings, respectively, said first and second brackets configured to rotationally fix said first and second lengths of lines to said isolator.

5. The electric isolator of claim 4 wherein said first and second fittings include a hex head, and wherein said first and second brackets each include an opening in the shape and size of said hex head such that said opening may be located about and in abutting contact with the perimeter of a respective said hex head.

* * * * *